United States Patent [19]

Leibovitz et al.

[11] Patent Number: 5,221,421
[45] Date of Patent: Jun. 22, 1993

[54] CONTROLLED ETCHING PROCESS FOR FORMING FINE-GEOMETRY CIRCUIT LINES ON A SUBSTRATE

[75] Inventors: Jacques Leibovitz, San Jose; Daniel J. Miller, San Francisco; Maria L. Cobarruviaz, Cupertino; John P. Scalia, San Jose, all of Calif.; Howard H. Nakano, Corvallis, Oreg.; Voddarahalli K. Nagesh, Cupertino; Clinton C. Chao, Redwood City, both of Calif.

[73] Assignee: Hewlett-Packard Company, Palo Alto, Calif.

[21] Appl. No.: 857,209

[22] Filed: Mar. 25, 1992

[51] Int. Cl.$^5$ .................. B44C 1/22; C23F 1/00
[52] U.S. Cl. .................. 156/642; 156/656; 156/659.1; 156/901; 156/345
[58] Field of Search .......... 156/642, 656, 659.1, 156/651, 664, 663, 665, 901, 902, 345; 252/79.5, 79.2; 423/462, 488, 499; 75/739, 741; 134/10, 13

[56] References Cited

U.S. PATENT DOCUMENTS 3,607,482  9/1971  Selm .................. 156/642
4,319,923  3/1982  Falanga et al. .................. 156/642 X

OTHER PUBLICATIONS

Elliott, D. J., *Integrated Circuit Fabrication Technology*, McGraw-Hill Book Company (New York), pp. 1–41, (1982).

Primary Examiner—William A. Powell

[57] ABSTRACT

A specialized etching method for producing fine-geometry gold circuit structures. Production thereof is accomplished by maintaining a constant gold etching rate. Metal etching normally slows as the amount of dissolved gold (a reaction product of the etching process) increases. To remove the dissolved gold, one method involves cooling the etchant to precipitate a gold complex therefrom. The remaining, recovered etchant is then heated and made available for continued etching. Another method involves a cathode/anode assembly which is immersed in the etchant. Activation of the assembly recovers metallic gold and regenerates the etchant. These methods, when used continuously or periodically in a dip or spray etching system, maintain a constant etching rate. As a result, fine-geometry circuit structures may be accurately produced while minimizing material costs (e.g. etchant use) and minimizing the production of undesirable waste products and disposal expenses associated therewith.

26 Claims, 2 Drawing Sheets

CONTROLLED ETCHING PROCESS FOR FORMING FINE-GEOMETRY CIRCUIT LINES ON A SUBSTRATE

BACKGROUND OF THE INVENTION

The present invention generally relates to the fabrication of conductive circuit patterns on a substrate, and more particularly to the production of fine-geometry circuit lines using an improved chemical etching process.

Rapid advances in computer technology have created a corresponding need for improved circuit fabrication methods. Basic circuit manufacturing techniques first involve obtaining a desired substrate (e.g. ceramic) on which the circuit is to be patterned. Thereafter, a metallic layer (e.g. gold) is applied to the substrate using conventional processes. Such processes typically involve the screen-printing of metallic inks and the like. The substrate and metal materials thereon are then fired to produce a thick metallic film on the substrate. Alternative methods for applying metal layers onto a substrate are described in Elliott, D. J., *Integrated Circuit Fabrication Technology*, McGraw-Hill Book Company (New York), pp. 1-41, ISBN No. 0-07-019238-3 (1982) which is incorporated herein by reference. Such methods include but are not limited to flash evaporation, filament evaporation, electron beam evaporation, and sputtering. After the metal layer is applied, a photoresist layer is applied directly onto the metal layer. Photoresist materials are light-sensitive and may be classified as either "positive" or "negative". Positive photoresist materials create a patterned image corresponding to the image which appears on the mask used in the process. Negative photoresist materials create a patterned image which is the exact reverse of the image normally produced by positive photoresist materials.

After the application of photoresist materials, they are conventionally "softbaked" which primarily involves the removal of various solvents and the like therefrom. Softbaking typically involves heating the substrate and materials thereon to a temperature of about 85-100 degrees C. using conventional methods including but not limited to known microwave and infra-red heating techniques. Temperature control during the softbake stage is important. As described in Elliott, supra, softbaking at a low temperature generally increases photoresist sensitivity, thereby making it more difficult to achieve proper circuit line width. In contrast, softbaking at excessively high temperatures reduces the photosensitivity of the resist materials, causing potential circuit definition problems.

After softbaking, a mask is positioned over the substrate. The mask has a plurality of open regions therein which correspond to the desired circuit pattern in the final product. Typical masks are produced from chromium, and are described in greater detail below. Light is then shined through the mask in order to create exposed and unexposed regions of the photoresist materials. A typical light source would involve a mercury-arc lamp known in the art capable of producing light within a wavelength range of about 200-500 nm with an intensity of about 5-10 mW/cm$^2$. However, other conventional light sources may be used for this purpose. Thereafter, a chemical developer known in the art is applied to the imaged photoresist layer. This material is designed to remove exposed regions of positive photoresist material or unexposed regions of negative photoresist material. As a result, various portions of the underlying metal layer are uncovered.

The next basic step in the circuit fabrication process involves removal of the uncovered portions of the underlying metal layer. This stage typically requires the use of a chemical etchant which is designed to react with and remove the uncovered metal portions. For example, in order to remove gold from a substrate, a suitable etchant known in the art for this purpose consists of a mixture of dissolved $I_2$ and dissolved KI. However, there are many important factors which must be considered in order for etching to occur effectively using this system.

Specifically, great care must be taken so that the removal process leaves accurately-defined regions of photoresist-covered metal on the substrate in order to produce the desired final product. In producing the final product, it is often desirable to create fine-geometry circuit lines which have a minimal width. Likewise it is advantageous to produce a circuit pattern in which the circuit lines are minimally spaced from each other. Circuit structures having these characteristics not only increase the amount of conductive pathways which may be placed on a substrate, but also provide higher frequency responses. For example, a conductive line in a microwave hybrid application which is about 50 microns wide will allow the formation of inductors with increased frequency performance (e.g. between about 8-16 GHz). This compares to a range of about 4-8 GHz when conductive lines are used which are each about 125 microns wide. In the case of multi-chip module substrates for computer systems, narrow-line width and spacing are highly desirable characteristics. Specifically, these characteristics enable a greater degree of circuit density to be achieved, as well as other peripheral benefits.

However, problems often result when the production of fine-geometry circuit lines (e.g. each having a width of about 15-75 microns which are spaced apart from each other by about 20-75 microns) is attempted using conventional technology. For example, etching at a constant rate is critical to the success of fine geometry circuit formation. Constant-rate etching controls the degree of "undercut" and therefore maintains fine-line dimensions with tight, highly controlled tolerances. The term "undercut" is traditionally defined to involve lateral etching of the metal layer beneath the edges of the photoresist layer. Excessive undercut results in insufficient circuit line width, thereby increasing the risk of circuit breaks and opens. Insufficient undercut results in excessive circuit line width and inadequate circuit line spacing.

Constant-rate etching does not normally occur when conventional etching processes are used. For example, with respect to the system described above in which gold is etched using a solution of dissolved $I_2$/KI, the etching rate slows substantially due to the depletion of $I_2$ and KI, as well as the accumulation of dissolved gold by products/complexes in the etchant. As this occurs, the etching rate progressively diminishes, thereby making it difficult to determine the amount of time necessary for completion of the etching process. This requires the system operator to continuously remove, rinse, and examine the substrates being etched. It may then be necessary to return the substrates to the etchant for additional etching. This process frequently results in excessive etching time, different/inconsistent degrees of etching, and uneven/uncontrolled undercut. As a result, the consistent production of fine-geometry circuit structures is prevented.

In view of these problems, conventional thick film fabrication technology (which is used as a low-cost alternative to thin film fabrication technology) is limited with respect to the dimensional circuit geometry which may be produced. For the purposes of this invention, "thick film fabrication technology" shall be defined as the screen printing of a metal ink known in the art onto a substrate (e.g. ceramic) and subsequent sintering of the substrate at controlled temperature levels. The metal ink used for this purpose typically consists of a metal powder suspension in a liquid with rheology control agents therein. The final product consists of a printable paste. Thick film fabrication technology in combination with currently-known etching techniques is traditionally limited to the production of circuit patterns in which the width of each circuit line is not less than about 100 microns (typically about 125 microns), with the distance between adjacent lines being not less than about 100 microns (typically about 125 microns). Thus, conventional thick film fabrication technology in combination with conventional etching techniques will not permit a sufficiently fine degree of circuit geometry to be achieved.

In contrast, conventional thin film fabrication technology is able to provide finer geometries. However, such technology is expensive and cannot withstand temperatures in excess of about 500 degrees C. which are often encountered when thick-film capacitors and resistors are produced for use in connection with the thin film circuit. Thus, a significant need remains for a circuit fabrication method which uses thick-film fabrication technology while allowing the production of fine-geometry circuit lines. The present invention accomplishes these goals in an effective manner through the use of a unique and specialized constant-rate etching process described in greater detail below. Likewise, the present invention also allows such goals to be accomplished while minimizing the use of expensive metals, minimizing the generation of undesirable chemical wastes, and enhancing the overall efficiency of the circuit fabrication process.

SUMMARY OF THE INVENTION

It is an object of the present invention to provide a circuit fabrication method of improved efficiency and versatility.

It is another object of the invention to provide a circuit fabrication method of improved efficiency and versatility which is easily implemented using a minimal number of process steps.

It is another object of the invention to provide a circuit fabrication method of improved efficiency and versatility which uses readily-available materials and processing equipment.

It is a further object of the invention to provide a circuit fabrication method which enables fine-geometry circuit lines to be achieved in connection with thick film fabrication technology.

It is further object of the invention to provide a circuit fabrication method which allows fine metal (e.g. gold) circuit lines with minimal spacing therebetween to be produced directly on top of a selected substrate (e.g. ceramic).

It is a still further object of the invention to provide a circuit fabrication method which enables chemical etching of the circuit in a rapid and efficient manner in which the chemical etchants are treated to remove dissolved gold by-products therefrom continuously so that the etching process may proceed at a constant rate.

It is an even further object of the invention to provide a circuit fabrication method which maximizes the recovery of expensive metals (e.g. gold) used in the fabrication process.

In accordance with the foregoing objects, the present invention involves a unique circuit fabrication method which enables fine-geometry circuit lines to be produced in a highly efficient manner with a minimal degree of line spacing. This is accomplished using a specialized chemical etching technique in which the chemical etchants are continuously replenished, decontaminated and/or regenerated in order to ensure constant-rate etching. Likewise, the techniques described herein enable the rapid recovery of metals removed during etching, and promote the efficient use of chemical etchants with minimal waste.

Specifically, the present invention involves a process in which a chemical etchant is used to remove uncovered layers of metal from a substrate in a manner wherein fine-geometry circuit lines are produced. A typical circuit structure produced in accordance with the invention consists of a plurality of narrow, conductive circuit lines each having a width of about 15-75 microns (about 50 microns=preferred) which are spaced apart from each other by about 20-75 microns (about 50 microns=preferred). In contrast, conventional etching processes involving thick film fabrication technology produce circuit lines each having a width of about 100-125 microns which are spaced apart from each other by about the same distance. The production of fine-geometry circuit structures as described herein is highly beneficial in that it enables greater circuit densities to be achieved, and facilitates the production of narrow, accurately defined structures which provide higher frequency responses.

In accordance with the present invention, a substrate is provided (e.g. ceramic) which has a layer of conductive metal thereon (e.g. gold) as indicated above. Using conventional photoresist patterning techniques, a layer of photoresist (positive or negative) is applied to the metal layer, followed by the conventional exposure and development thereof to produce a pattern in which a portion of the gold layer is covered by photoresist and a portion of the gold layer is uncovered. The uncovered portion is then etched in accordance with the present invention to produce the fine-geometry circuit lines previously described. To accomplish this, a controlled etching process is used in which the uncovered portion of the gold layer is etched at a constant rate. This is a clear departure from prior processes in which the etching rate decreases as the concentration of dissolved metal by-products in the etchant increases during the etching process. Constant-rate etching enables the production of fine-geometry circuit structures because it precisely controls the degree of undercut (as defined above) and therefore consistently maintains fine-line dimensional tolerances. In addition, the constant-rate etching processes of the present invention enable rapid recovery of the etched metal, and minimize chemical etchant use.

Constant-rate etching in accordance with the present invention may be achieved using two basic methods. Both methods involve the use of a chemical etchant consisting of dissolved KI and $I_2$ as described in greater detail below. To implement the first method, a photoresist-patterned substrate having covered and uncovered portions of gold is placed in contact with the etchant. The substrate may either be immersed in an etchant bath or conventionally sprayed with etchant. During etching, it is preferred that the etchant be maintained at a temperature of about 30–50 degrees C. As the etchant comes in contact with the uncovered portions of gold, these portions are correspondingly etched from the substrate. As a result, a liquid product is produced which consists of unreacted etchant (containing dissolved $I_2$ and dissolved KI) combined with a gold reaction product (e.g. a dissolved gold complex) which may be written as follows: $AuI.KI_{3(aq.)}$. The liquid product is then cooled to a temperature sufficient to cause precipitation of the dissolved gold complex from the unreacted etchant (e.g. about 0–4 degrees C.). The resulting black precipitate is then treated to recover metallic gold therefrom using a variety of methods and techniques. For example, an exemplary treatment method involves contacting the precipitate with water in an amount sufficient to produce solid AuI and a solution containing dissolved $I_2$ and dissolved KI therein. The amount of water suitable for this purpose is about 5–50 ml/g of precipitate. The remaining solution containing dissolved $I_2$ and dissolved KI is then returned to the etching system for the continued etching of gold from the initial substrate or from subsequent substrates. The solid AuI is thereafter heated at a temperature of about 100–150 degrees C. for a time period of about 60–200 minutes in order to produce metallic gold and $I_2$ vapor. The $I_2$ vapor is likewise returned to the etching system for the continued etching of gold from the initial substrate or from subsequent substrates.

An alternative method for recovering metallic gold involves the following steps:

1. Heating the resulting black precipitate described above at about 150–300 degrees C. for about 60–200 in order to produce $I_2$ vapor, KI crystals and pure gold powder;
2. Returning the $I_2$ vapor to the etching system for reuse;
3. Dissolving the KI crystals by combining the crystals (and gold powder) with deionized water;
4. Recovering the gold powder using conventional filtration techniques; and
5. Returning the KI aqueous solution prepared as described above in step 3 to the etching system for reuse.

The unreacted etchant which now contains substantially less dissolved gold (due to removal of the dissolved gold complex as indicated above) is then heated to a temperature of about 30–50 degrees C. and returned to the etching system for additional etching of the uncovered portions of gold on the original substrate and/or the etching of additional substrates. The return of treated etchant in this manner enables constant-rate etching to take place, and facilitates the production of fine-geometry circuit structures as noted above. More specifically, the constant removal of gold reaction products from the etchant in combination with the other procedures described above enables the etchant to continuously function without being hindered by excessive amounts of gold by-products dissolved therein. As a result, reductions in etching rate are avoided.

The second etching method of the present invention again involves the use of a chemical etchant consisting of dissolved KI and $I_2$. To implement the second method, a photoresist-patterned substrate having covered and uncovered portions of gold as described above in the first method is placed in contact with the etchant. The substrate may either be immersed in an etchant bath or conventionally sprayed with etchant. During etching, it is again preferred that the etchant be maintained at a temperature of about 30–50 degrees C. The resulting liquid product (consisting of unreacted etchant containing dissolved $I_2$ and dissolved KI in combination with substantial amounts of aqueous gold by-products [e.g. $AuI.KI_{3(aq.)}$]) is then treated using an electrodeposition process. Specifically, a cathode/anode assembly is provided for this purpose. In a preferred embodiment, the cathode is made from gold or a gold-plated substrate (e.g. ceramic), with the anode being made from platinized platinum or a platinized substrate (e.g. titanium or niobium mesh). In a preferred embodiment, an electric current source (e.g. a current regulated power supply) is connected to the cathode and anode in order to place the cathode and anode under an electrical potential. Thereafter, the cathode and anode are immersed within the liquid product, with the electric current source causing the passage of a current of about 65–120 $mA/cm^2$ through the cathode and anode. As result, the dissolved gold complex is decomposed into metallic gold and a recovered/regenerated etchant solution consisting primarily of dissolved KI and dissolved $I_2$. The metallic gold is plated onto the cathode which is withdrawn from the recovered etchant solution before the metallic gold falls off of the cathode. The metallic gold is then physically removed from the cathode after withdrawal as indicated above. The recovered/regenerated etchant solution (in combination with any initially unreacted etchant) is then used to continue the etching of gold from the initial substrate or from subsequent substrates. As a result, the etching process proceeds at a constant, optimum rate while avoiding any reductions in etching efficiency caused by the use of chemical etchants having excessive amounts of gold by-products dissolved therein.

The present invention therefore represents an advance in the art of chemical etching and the production of fine-geometry circuit structures. Accordingly, additional details of the invention, as well as further objects, features, and advantages thereof will be described in the following Brief Description of the Drawings and Detailed Description of Preferred Embodiments.

DETAILED DESCRIPTION OF PREFERRED EMBODIMENTS

Figure 1:
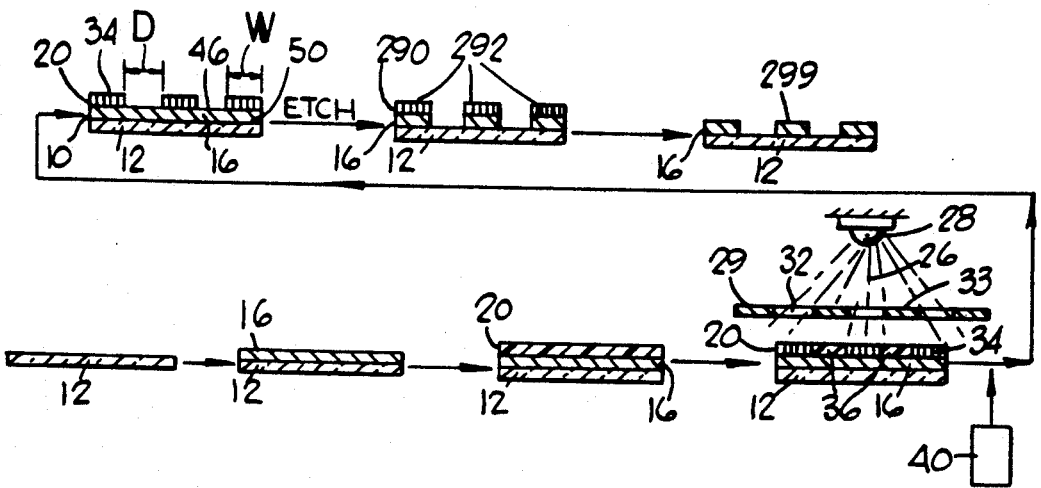
FIG. 1 is a schematic representation of the process steps used to form a substrate having a layer of metal thereon which is partially covered with photoresist in a selected pattern.

The present invention involves a method for producing fine-geometry circuit structures using thick film circuit fabrication technology. As previously indicated, conventional thick film production/etching techniques are traditionally limited to the manufacture of conductive circuit lines each having a width of about 100-125 microns which are spaced apart from each other by about 100-125 microns. Specifically, conventional etching techniques involved the application of etchants in a manner wherein the etchants became contaminated with large amounts of dissolved metal reaction products. In turn, the production of metal reaction products resulted in a depletion of active etchant ingredients. Notwithstanding these problems, the contaminated etchant solutions were allowed to remain in contact with the circuits being etched. As a result, the etching rate slowed to an ineffective level. Once this level was reached, the contaminated etchants were removed and sent to a separate facility for metal recovery and toxic waste disposal. Accordingly, conventional etching processes were not conducted at a constant rate, with the etching rate continuously decreasing due to: (1) etchant contamination with dissolved metal materials and (2) the depletion of active etchant ingredients. This continuous decrease in etching rate resulted in a corresponding decrease in production output, increased costs, and the increased generation of undesired waste materials.

In addition, and most important, the lack of a constant etching rate prevented the production of fine-geometry circuit structures which are desirable for a number of reasons. The etching of a metal section on a substrate at a variable rate prevents the control of "undercut" during etching. As noted above, the term "undercut" basically involves the lateral etching of metal materials beneath the edges of the photoresist layer. Variable-rate etching causes uncontrolled undercut because it prevents the accurate and precise determination of etching time. For example, the operator in a conventional etching system is required to remove the substrates being etched, rinse them, conduct a thorough examination, and return the substrates for additional etching if necessary. This procedure frequently causes the etching process to be uncontrolled and inconsistent. For example, the substrates were often over-etched (e.g. therefore causing excessive undercut), especially when fresh etchant was used in the system. The use of fresh etchant resulted in excessively rapid etching which caused increased undercut. Also, when the etching rate decreased to an undesirable level, the system operator would typically increase the etchant temperature. This step was designed to accelerate the etching process which is temperature-dependent. However, increases in system temperature also caused temperature differentials in the system, thereby resulting in inconsistent etching and uncontrolled levels of undercut. Finally, each time the substrates were removed for inspection, residual etchant materials thereon would continue the etching of metal materials until rinsing was completed. This problem also resulted in a lack of precise etching/undercut control.

A lack of undercut control caused by the foregoing problems prevents the formation of fine-geometry circuit lines (e.g. lines having a width of about 15-75 microns). Instead, circuit lines of much greater width were typically produced in order to compensate for over-etching caused by excessive undercut. Likewise, the spacing between circuit lines was normally increased in order to compensate for situations involving an insufficient degree of undercut. This step was taken to ensure that electrical shorts would not occur between adjacent circuit lines on the substrate.

In contrast, the present invention involves a constant-rate etching method which avoids the problems associated with variable-rate etching. Use of the invention enables the application of thick film fabrication technology to produce circuit structures having individual conductive lines with an average width of about 15-75 microns (about 50 microns=preferred) which are separated from each other by about 20-75 microns (about 50 microns=preferred). This type of circuit structure offers a substantial degree of circuit density, and maintains fine-line dimensions with controlled tolerances which are highly useful in a wide variety of high frequency circuits and computer-related applications. In addition, the methods described herein enable the rapid recovery of etched metal materials while minimizing the use of chemical etchants.

With reference to FIG. 1, the basic steps are illustrated for producing a circuit structure 10 having a metal layer partially covered with photoresist in a selected pattern. The completed circuit structure 10 (as described in greater detail below) is ready to be etched in accordance with the methods of the present invention. It should be noted that the materials and construction methods used to produce the circuit structure 10 are known in the art, as described on pages 1-41 of Elliott, D. J., *Integrated Circuit Fabrication Technology*, McGraw-Hill Book Company (New York), ISBN No. 0-07-019238-3 (1982) which is again incorporated herein by reference. While specific materials and other parameters are described with reference to the circuit structure 10, such materials and parameters are for example purposes only and shall not limit this invention in any manner. In addition, the layers of materials shown in FIG. 1 are enlarged for the sake of clarity.

With continued reference to FIG. 1, a substrate 12 is provided which is made from a ceramic material selected from the group consisting of alumina, sapphire, aluminum nitride, quartz, fused silica, and the like, with alumina being preferred. Applied to the substrate 12 using conventional techniques including but not limited to thick film processes known in the art is a layer 16 of gold having a preferred thickness of about 6 microns (± about 2 microns). After application of the layer 16 of gold, the substrate 12 is preferably baked at about 130 degrees C. (± about 5 degrees C.) for at least about 20 minutes in order to remove residual moisture from the surface of the layer 16 of gold. Next, a layer of adhesion promoter (not shown) having a thickness of about 0.3 microns (± about 0.1 microns) is applied to the layer 16 of gold using conventional spin deposition techniques (e.g. at about 5000 RPM for about 20 seconds). An exemplary adhesion promoter is sold under the name "HMDS" by KTI Chemicals, Inc. of Sunnyvale, Calif.

With continued reference to FIG. 1, a layer 20 of photoresist having a thickness of about 6.0 microns (± about 1.0 microns) is applied to the layer of adhesion promoter on the layer 16 of gold. The photoresist may be of the positive or negative variety, as defined herein and discussed in Elliott, D. J., supra. An exemplary photoresist material suitable for use in the embodiment of FIG. 1 is a negative resist sold under the name "SC Resist" by Olin-Hunt Specialty Products, Inc., of West Paterson N.J. (catalog #201-585-7100). The layer 20 of photoresist is applied by conventional spin deposition techniques (e.g. at about 2000 RPM for about 20 seconds) to a thickness of about 7 microns. After application of the layer 20 of photoresist, the substrate 12 and layers of materials thereon are softbaked at about 98 degrees C. (± about 2 degrees C.) for about 45 minutes (± about 5 minutes).

The substrate 12 and layers of materials thereon are then exposed to light 26 from a source 28 for about 70 seconds having a wavelength of about 300–400 nm with an intensity of about 8 mW/cm$^2$. The source 28 of light 26 preferably consists of a mercury lamp. The light 26 passes through a mask 29 which is positioned between the source 28 and the substrate 12. The mask 29 (schematically illustrated in FIG. 1) includes a plurality of elongate openings 32 therethrough which correspond (in this embodiment) with the desired areas of the layer 16 of gold which will remain after etching to create the final circuit structure. In a preferred embodiment, the mask 29 is manufactured of a glass substrate having a layer of chromium thereon. In a negative photoresist system (as used in this embodiment), the openings 32 through the mask 29 (which correspond to the regions of the layer 16 of gold which are to remain intact) should have a width greater than the width of the corresponding gold regions which will remain intact in the final circuit product. For example, in an embodiment having a layer 16 of gold which is about 6 microns thick, the production of circuit lines which each have a width of about 50 microns will require each opening 32 to be about 64 microns wide. In the present embodiment (using a layer 16 of gold which is about 6 microns thick), to produce individual circuit lines having a width of about 15–75 microns, each opening 32 should have a width of about 29–89 microns Likewise, intact sections 33 of the mask 29 as shown in FIG. 1 (which correspond to the regions of the layer 16 of gold which are to be removed) should have a width less than the width of the removed regions of layer 16. For example, to produce a gap between adjacent conductive gold circuit lines which is about 50 microns wide, each intact section 33 should have a width of about 36 microns. In the present embodiment (again using a layer 16 of gold about 6 microns thick), to produce individual circuit lines which are separated from each other by about 20–75 microns, each intact section 33 should have a width of about 6–61 microns. Exemplary masks suitable for the purposes described herein are commercially available from HTA, Inc. of San Jose, Calif.

After light exposure as described above, the layer 20 of photoresist will have exposed regions 34 and unexposed regions 36 thereon as illustrated. Next the layer 20 of photoresist is treated with a conventional negative resist developer 40. The negative resist developer 40 is applied using known spray developing techniques. An exemplary negative resist developer 40 is sold under the name "Waycoat Negative Resist Developer" by Olin-Hunt Specialty Products, Inc., of West Paterson N.J. (catalog #837773). After application of the negative resist developer 40, the layer 20 of photoresist is rinsed with N-butyl acetate and spin-dried at about 3000 RPM for about 20 seconds.

The resulting circuit structure 10 as shown in FIG. 1 consists of the substrate 12 having uncovered portions 46 of gold and covered portions 50 of gold thereon. The covered portions 50 of gold actually consist of the layer 16 of gold having the exposed regions 34 of photoresist thereon.

Thereafter, the substrate 12 and layers thereon are hardbaked at a temperature of about 130 degrees C. (±5 degrees C.) for about 30 minutes. This procedure hardens the exposed regions 34 of photoresist and improves the etch-resistance thereof. Next, the uncovered portions 46 of gold are cleaned in order to eliminate residual contaminants therefrom. This is accomplished in the present embodiment through the use of a conventional plasma ashing apparatus wherein the substrate 12 is treated in a pure oxygen atmosphere at 90 SCCM, 200 W, and 100 MTORR for about 7 minutes.

At this stage, the circuit structure 10 is ready for etching. As indicated above, etching must be done in a careful and controlled manner so that the fine-geometry dimensional characteristics of the circuit structure 10 are maintained. With respect to circuit structure 10, the covered portions 50 of gold will become conductive circuit lines in the completed structure 10. For a layer 16 of gold about 6 microns thick, it is preferred that the covered portions 50 of gold have a width "W" as shown in FIG. 1 of about 29–89 microns (about 64 microns-=optimum) in order to produce final circuit lines after etching each having a width of about 15–75 microns (about 50 microns=optimum). Likewise, it is preferred that the distance "D" between the covered portions 50 of gold (corresponding to the width of the uncovered portions 46 of gold) be about 6–61 microns (about 36 microns=optimum) in order to produce circuit lines after etching which are separated from each other by about 20–75 microns (about 50 microns=optimum). To achieve these dimensional parameters using thick film technology, the rate at which the uncovered portions 46 of gold are etched must be maintained at a constant level with a consistent degree of undercut. Otherwise, problems will result as described in detail above. To accomplish constant-rate etching in accordance with the present invention, two methods are provided. Both of these methods basically involve control of the etching system and chemical etchants in order to remove gold reaction products therefrom. Contamination of the etchants with gold reaction products substantially and continuously decreases the etching rate, thereby preventing the consistent production of fine-geometry circuit structures.

In order to achieve constant-rate etching in accordance with the present invention, two basic methods are used. These methods are as follows:

METHOD 1

Figure 2:
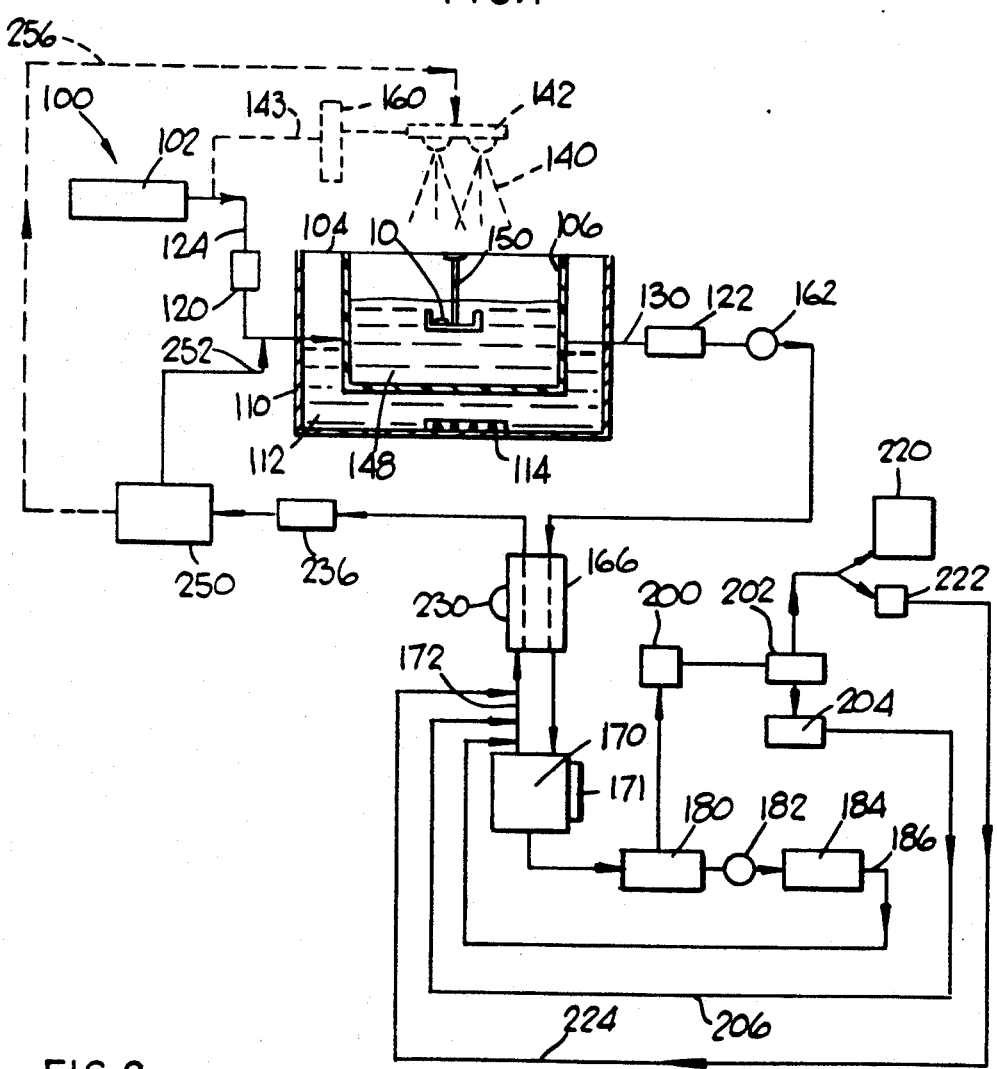
FIG. 2 is a schematic process diagram of a first embodiment of the present invention wherein the uncovered metal portions of the structure of FIG. 1 are etched at a constant rate to produce a fine-geometry circuit structure.

This method is schematically illustrated in FIG. 2. It should be noted that the present invention as described in the following methods shall not be limited to any specific equipment units and/or chemicals which may be described herein. The invention may be implemented using a variety of components and materials other than those specifically recited below.

With reference to FIG. 2, an etching system 100 produced in accordance with a first embodiment of the present invention is schematically illustrated. The etching system 100 first includes a supply 102 of chemical etchant. The chemical etchant is basically known in the art and consists of a solution of dissolved KI and dissolved $I_2$. By way of example, a one liter sample of the KI/$I_2$ etchant solution may be prepared as follows:

1) Heat one liter of deionized $H_2O$ to a temperature of about 50 degrees C. and maintain the $H_2O$ at that temperature.

2) Stir the $H_2O$ while maintaining the above temperature.

3) Add 166.0 g of solid KI to the $H_2O$ while continuing to stir until all of the KI is dissolved.

4) Pour 80 g of $I_2$ crystals into the solution formed after the completion of step number 3 and continue to stir until all of the $I_2$ crystals have dissolved. In the alternative, the solution (immediately after addition of the $I_2$ crystals) may be transferred to an ultrasonic bath which is energized until all of the $I_2$ crystals are dissolved.

Commercially, the foregoing etchant is available from Film Micro-Electronics, Inc. of Burlington, Mass. under the designation "C35". It is indicated by this manufacturer that the foregoing etchant has a nominal gold etching rate of about 1.0 microinch/minute. The commercially available etchant and the etchant produced in accordance with the steps listed above have an $I_2$:KI mole ratio of about 2:7, with the actual concentrations of $I_2$ and KI being about 0.3 mole/liter and about 1 mole/liter, respectively.

Next, the supply 102 of chemical etchant is routed into a reaction vessel 104. The reaction vessel 104 preferably consists of a first tank 106 which is manufactured of an etch-resistant composition (e.g. high density polyethylene). Contaminants may be initially removed from the first tank 106 by passing a preliminary supply of the foregoing chemical etchant therethrough and discarding the preliminary supply prior to actual use of the main supply 102 of etchant.

The reaction vessel 104 further includes a second tank 110 which is larger than the first tank 106, and is designed to retain a supply 112 of water therein. As shown in FIG. 2, the second tank 110 is sized to receive the first tank 106 so that the first tank 106 is positioned within the supply 112 of water. The water may then be heated as desired, preferably using a conventional immersion heater 114 known in the art or other standard heating device. Heating of the supply 112 of water in this manner imparts heat to the first tank 106 and contents thereof as will be described in greater detail below. The construction materials used to produce the second tank 110 are not overly critical since it is not coming in contact with any etchant materials.

At this point, it should be noted that the etching system 100 may have one or more filter units designed to remove particulates and chemical contaminants from the etchant passing into and/or out of the first tank 106 of the reaction vessel 104. The number and exact position of these filter units in the etching system 100 may vary, with the embodiment of FIG. 2 including two filter units 120, 122. Filter unit 120 is positioned within conduit 124 which connects the supply 102 of chemical etchant with the first tank 106. Filter unit 122 is positioned within conduit 130 which leads out of the first tank 106 as illustrated. Filter units 120, 122 (and any other filter units described herein) are of a type known in the art which may include activated carbon units in combination with conventional polypropylene filter cartridges capable of removing particles as small as 0.5 micron. Conduits 124 and 130 (as well as the other conduits described herein) are produced of an etch-resistant material, including but not limited to polyethylene, polypropylene, or other comparable inert compositions known in the art.

The circuit structure 10 (which is ready for etching) is then placed in contact with the etchant so that chemical etching of the uncovered portions 46 of gold may proceed until the removal thereof is completed. This may be accomplished in two ways. First, the circuit structure 10 may be contacted with a spray 140 of etchant from a nozzle system 142 positioned above the reaction vessel 104 which is schematically illustrated. In a preferred embodiment, circuit structures to be etched using a spray system are oriented so that the surfaces thereof are substantially perpendicular to the spray 140 of etchant. The nozzle system 142 is in fluid communication with the supply 102 of etchant via conduit 143 as illustrated. Unreacted etchant and the gold reaction products dissolved therein would then be collected in the first tank 106 of the reaction vessel 104. The use of a nozzle system 142 and spray 140 therefrom (as well as other components associated therewith) are shown in FIG. 2 by dashed lines. In the alternative, the circuit structure 10 may be immersed (e.g. dipped) within a bath 148 of etchant contained within the first tank 106 of the reaction vessel 104.

Both dip and spray etching techniques as described above are well known in the art. Each of these techniques has particular advantages. Spray etching performs better than dip etching with respect to etching uniformity, speed, and throughput. Because of its larger throughput, spray etching is more economical when large-scale operations are involved. For small or moderate-scale production, dip etching may be less expensive because of the minimal equipment requirements associated therewith. Accordingly, the present invention shall not be limited to either of these methods, and is equally applicable to both. However, for the sake of clarity, the remaining portions of the description presented herein shall be described with reference to procedures involving dip etching.

During the etching process, the circuit structure 10 is preferably retained within a carrier unit 150 which is schematically illustrated in FIG. 2. The carrier unit 150 may have a plurality of openings therein of variable size (not shown) in order to allow etchant materials to pass therethrough. The carrier unit 150 may also be suitably agitated either manually or automatically using conventional means during etching in order to promote the etching process. Mild agitation is especially important when dip etching is used.

Immediately upon contact of the etchant with the uncovered portions 46 of gold on the circuit structure 10, etching of the gold occurs. The primary active ingredient in the etchant is dissolved $I_2$ which functions as a powerful oxidant in the aqueous KI solution. Gold oxidation proceeds in accordance with the following reaction sequence:

$$2Au_{(metal)} + I_{2(aq.)} \rightarrow 2AuI_{(aq.)} \quad (1)$$

Both $I_2$ and AuI are insoluble in water, but soluble in aqueous solutions of KI by forming complex compounds. The complexing reaction may be written as follows:

$$I_{2(solid)} + KI_{(aq.)} \rightarrow KI_{3(aq.)} \quad (2)$$

$$AuI_{(solid)} + KI_{3(aq.)} \rightarrow AuI.KI_{3(aq.)} \quad (3)$$

It is important to consider the two electrochemical reactions which form the underlying basis for reaction (1) as follows:

$$2Au_{(metal)} \rightarrow 2Au^+_{(aq.)} + 2e^- \quad (4)$$

$$I_{2(aq.)} + 2e^- \rightarrow 2I^-_{(aq.)} \quad (5)$$

Reaction (4) represents the anodic oxidation of the gold metal. Reaction (5) represents the cathodic reduction of the $I_{2(aq.)}$. The sum of reactions (4) and (5) yields reaction (1), e.g., the gold etching process. For reaction (1) to proceed, the equilibrium electrode potential [E(c)] of reaction (5) must be higher than (e.g., positive relative to) the electrode potential [E(a)] of reaction (4) as follows:

$$E(c) - E(a) > 0 \quad (6)$$

For condition (6) to be satisfied, the molar concentration of $Au^+$ ions must be less than $5 \times 10^{-19}$. Accordingly, for the etching process to proceed in an efficient manner, it is necessary to complex the $Au^+$ ions in order to maintain the concentration limit thereof in the etchant solution below the requisite limit described above. This requirement is satisfied by complexation with, e.g., $KI_{3(aq.)}$. The electrochemical reaction summarizing this process may be written as follows:

$$2Au_{(metal)} + 2KI_{3(aq.)} + 2I^-_{(aq.)} \rightarrow 2AuI.KI_{3(aq.)} + 2e^- \quad (7)$$

Similarly, the cathodic process including the complexed iodine may be written as follows:

$$KI_{3(aq.)} + 2e^- \rightarrow KI_{(aq.)} + 2I^-_{(aq.)} \quad (8)$$

Accordingly, the entire etching process is best represented by the sum of reactions (7) and (8) as follows:

$$2Au_{(metal)} + 3KI_{3(aq.)} \rightarrow KI_{(aq.)} + 2AuI.KI_{3(aq.)} \quad (9)$$

Thus, as etching proceeds, a liquid product is produced which basically includes unreacted etchant (containing residual dissolved $I_2$ and dissolved KI) having a dissolved gold reaction product/complex (e.g. $AuI.KI_{3(aq.)}$) therein.

There are many factors which control the etching rate in the foregoing process as follows:

A. Dissolved gold concentration in the etchant.—Etching rates decrease as gold concentration increases.

B. Solubility of gold in the etchant.—This is a function of dissolved $I_2$ and dissolved KI concentrations in the etchant. Higher $I_2$ and KI concentrations increase the gold solubility level, with increased gold solubility causing a corresponding increase in etching rate.

C. The etching solution temperature.—Etching rates increase with increasing temperature.

D. The properties of the gold layer (e.g. purity, porosity, etc.) affect etching rates.

E. The hydrodynamic conditions of the etching system influence etching rate. For example, in the case of spray etching, droplet size, nozzle layout, velocity distribution, etch pattern geometry and the like are important considerations. With respect to dip etching, dimensional clearances within the carrier unit 150, agitation rate, and etch pattern geometry are likewise important. Regarding agitation, the stronger the agitation, the higher the etching rate. However, excessively strong agitation may cause non-uniform etching of the substrates being processed. Therefore, mild agitation is preferred, as is well known in the art.

As indicated above, it is necessary to maintain a constant etching rate in order to ensure that fine-geometry circuit structures (e.g. conductive lines) are produced. A key factor in achieving a constant etching rate is item "A" above which involves the dissolved gold concentration in the etchant. Increasing amounts of dissolved gold materials in the etchant will greatly decrease the gold etching rate in the system. In fact, tests have shown that the etching rate decreases linearly as dissolved gold concentration increases. Accordingly, it is necessary to control dissolved gold concentration in the etchant in order to ensure that constant-rate etching is achieved. This is important in dip etching systems where the etching rate in the etchant bath decreases as gold concentration increases. Likewise, it is important in spray etching systems where the unreacted etchant collected in the first tank 106 of the reaction vessel 104 is to be reused/recirculated. The use of etchant materials having substantial amounts of dissolved gold materials (e.g. $AuI.KI_{3(aq.)}$) therein will cause a significant decrease in etching rate in accordance with the principles indicated above.

Prior circuit production methods involving the materials described herein did not include any procedures for controlling the etchant composition and the corresponding rate at which circuits were etched. Typically, circuit structures were loaded into a basket-type carrier and dipped in the etchant, with constant agitation of the carrier. As expected, the etching rate decreased continuously over time. After a selected time period, the carrier was removed from the etchant and the circuit structures rinsed with deionized water. Thereafter, the circuit structures were visually inspected. When necessary, the carrier and circuit structures were returned to the bath for additional etching. These steps were repeated until the desired degree of etching was achieved. As a result, the total etching time increased with each batch of circuit structures being etched. Finally after a determination that the etching time exceeded a preselected limit, the etchant (having gold reaction products accumulated/dissolved therein) was removed and shipped to a remote location for gold recovery. The remaining solution obtained after gold recovery was discarded in a suitable manner. Accordingly, this procedure was both labor-intensive and required substantial quantities of etchant. In addition, it generated a significant amount of toxic waste. Finally, and most important, it did not permit constant-rate etching which is necessary to control undercut and produce fine-geometry circuit structures as indicated above.

In order to achieve a constant etching rate in accordance with the present invention, a number of unique procedures are followed. First, when dip etching is desired, the initial etchant from the supply 102 is routed via conduit 124 into the first tank 106 of the reaction vessel 104. Thereafter, the heater 114 is activated in order to heat the supply 112 of water and maintain the etchant in the bath 148 at a temperature of about 30–50 degrees C. (optimum=about 30 degrees C.). Within this temperature range, the solubility of gold in the etchant is about 19–22 g of elemental gold/liter of etchant, with the gold solubility level correspondingly increasing with increased temperature. If an etchant temperature of about 30 degrees C. was used, the solubility of gold in the etchant would be at the lower end of the foregoing range or about 19 g of gold/liter of etchant.

When spray etching is used, the supply 102 of etchant may be preheated to the foregoing temperature level using an in-line resistance heater unit 160 known in the art or any other conventional heating system which may be positioned within or in contact with the conduit 143 so that the etchant from the supply 102 may be heated prior to spraying.

After the etchant contacts the circuit structure 10, a liquid product is generated which consists of unreacted etchant (containing residual dissolved $I_2$ and dissolved KI) combined with a gold reaction product. This product is a dissolved gold complex which is currently understood to have the formula $AuI.KI_{3(aq.)}$ as indicated above. As increased amounts of the gold complex are generated, the unreacted etchant becomes increasingly contaminated therewith. Likewise, the increased production of gold complex results in a corresponding depletion of dissolved KI and $I_2$. These events substantially slow the etching rate both in dip etching systems where the circuit structures are continuously maintained within the contaminated etchant in the bath 148, and in spray etching systems where the unreacted etchant collected in the first tank 106 of the reaction vessel 104 is to be reused/recirculated.

To remove the foregoing gold complex from the unreacted etchant, the liquid product containing both unreacted etchant and gold complex is continuously withdrawn from the first tank 106 of the reaction vessel 104 through filter unit 122 and conduit 130. Withdrawal of the liquid product is accomplished through the use of a conventional centrifugal pump 162 which is positioned within and/or in fluid communication with the conduit 130. In a preferred embodiment, withdrawal of the liquid product from the reaction vessel 104 is continuous as noted above. This applies to both dip etching and spray etching systems. The liquid product (e.g. unreacted etchant and gold complex) which leaves the reaction vessel 104 will have a gold concentration level of above 12 g of gold/liter of etchant (typically about 12.5 g of gold/liter of etchant) due to the dissolved gold complex therein. The liquid product thereafter passes into a counter-current heat exchanger 166 which is of a type well known in the art. After passing through the heat exchanger 166, the liquid product enters a crystallization chamber or tank 170 where it is cooled to a temperature of about 0-4 degrees C. (about 2 degrees C.=optimum). At this temperature, the solubility of gold within the etchant will decrease to a level of about 12 g of gold/liter of etchant. Thus, if the etchant has more than 12 g/liter of gold dissolved therein, the excess gold materials will precipitate therefrom upon cooling as described below.

Cooling may be accomplished using a number of known techniques. For example, cooling may occur and/or be enhanced through the use of a conventional refrigeration or evaporative cooling unit 171 operatively connected to the tank 170 (schematically illustrated in FIG. 2) which is designed to lower the temperature of the liquid product in the tank 170 to the desired level. In addition, the liquid product may be pre-cooled prior to entry into the tank 170 by the counter-current heat exchanger 166 described above. Specifically, once the initial batch of liquid product is cooled within the tank 170 and the desired precipitation reaction occurs as described below, the cooled, residual etchant is withdrawn from the tank 170 through a conduit 172 which passes through the counter-current heat exchanger 166. As a result, cooled etchant leaving the tank 170 is able to pre-cool the warm liquid materials entering the tank 170 by the mutual passage of both materials through the counter-current heat exchanger 166. Pre-cooling in this manner substantially decreases the time and energy needed to cool the liquid product in the tank 170 to the desired temperature. It should also be noted that there are a number of alternative conventional methods which may be used to cool and/or pre-cool the liquid product within the tank 170. Accordingly, the present invention shall not be limited to any specific cooling methods.

Once the liquid product is cooled within the tank 170, a precipitation reaction occurs. This reaction takes place because the liquid product (prior to entry into the tank 170) has a dissolved gold concentration level of above 12 g/liter as noted above. As cooling of the liquid product occurs within the tank 170, the solubility of gold within the liquid product drops to about 12 g/liter as noted above. Thus, excess dissolved gold materials will precipitate from the liquid product until a dissolved gold level of about 12 g/liter is reached. The excess dissolved gold materials will precipitate in the form of a solid, black gold complex (e.g. precipitate) determined to have the formula $AuI.KI_{3(solid)}$ as noted above. In addition, the foregoing precipitation reaction produces a supply of etchant having a consistent composition which is characterized by a substantially reduced amount of dissolved gold therein (e.g. approximately 12 g of gold/liter of etchant at about 2 degrees C., assuming an initial etchant concentration of about 0.3 mole/liter of $I_2$ and about 1.0 mole/liter of KI).

The precipitate (shown at reference number 180 in FIG. 2) is physically removed from the remaining etchant materials, and is conventionally decanted (e.g., using a standard vacuum filtration system 182 or other comparable apparatus known in the art). Liquid 184 recovered from this step (consisting primarily of etchant materials) is routed via conduit 186 into conduit 172 for combination with the etchant materials leaving the tank 170 as described in greater detail below.

The precipitate 180 is then combined with a supply 200 of deionized $H_2O$ and agitated until the precipitate 180 is completely dissolved. The amount of $H_2O$ required for this purpose is about 5 ml $H_2O$/g of precipitate 180. As a result, a supply 202 of yellowish AuI crystals are formed which are conventionally separated from the remaining solution 204 which consists primarily of dissolved KI and $I_2$. The solution 204 is routed via conduit 206 into line 172 for reuse as further described below. The water added to the etchant is insufficient to make up for water loss during evaporation. Therefore, enough water is used in this stage of the process to maintain a desired etchant level in tank 106 when a dip etching system is used. The supply 202 of AuI crystals is then air dried and heated at a temperature of about 140 degrees C., thereby forming a supply 220 of pure, finely divided metallic gold and $I_2$ vapor 222. The $I_2$ vapor 222 is routed via conduit 224 into the conduit 172 for reuse as described below.

With reference to the tank 170, the recovered etchant (having a dissolved gold level of about 12 g/liter at about 2 degrees C.) is removed therefrom using a centrifugal pump 230 or the like which draws the etchant into and through the counter-current heat exchanger 166 from conduit 172 where it is combined with the KI and $I_2$ materials described above which are received from conduits 186, 206, and 224. Within the heat exchanger 166, the temperature of the etchant materials is increased, thereby resulting in an increased gold solubility level (e.g. the capacity to retain gold therein). The etchant is then passed through a filter unit 236 and routed through a heater 250 of a type known in the art (e.g. a conduit or cylindrical vessel surrounded by conventional resistance heating tape). Within the heater 250, the temperature of the etchant is raised to about 30–50 degrees C. in order to produce a supply of heated, recovered etchant solution which is ready for reuse/recirculation. Within this temperature range, the etchant gold solubility level is further increased to between about 19-22 g of gold/liter of etchant, thereby suitably "reactivating" the etchant (and rendering it "unsaturated") so that it may be redirected via conduit 252 (if a dip etching system is used) back into the first tank 106 of the reaction vessel 104 for continued etching of the initial circuit structure 10. If a spray etching system is used, the etchant leaving the heater 250 is routed via conduit 256 (shown in dashed lines in FIG. 2) into the nozzle system 142 for reuse.

Periodically, the addition of minimal quantities of fresh etchant to the system 100 from supply 102 will be necessary since some of the initial etchant materials are lost (e.g. by drag out) in the foregoing process. This may be accomplished by periodic additions of fresh etchant from the initial supply 102 as described above. The addition of fresh etchant materials is undertaken in view of numerous factors, including the quantity and size of processed substrates. Accordingly, the amount and frequency of fresh etchant addition is experimentally characterized for each different processing application.

The foregoing method enables fresh, unsaturated etchant materials to be delivered to a circuit structure in a continuous cycle at a constant composition so that a constant etching rate may be achieved (e.g. at a rate of about 0.5 micron of gold/minute). More specifically, the foregoing method involves the constant delivery of "regenerated", unsaturated etchant materials to a circuit structure in order to avoid excessive contamination of the etchant and a progressive slowing of the etching process. As a result, constant-rate etching is achieved which enables fine-geometry circuit structures to be produced using thick film fabrication technology. In addition, the foregoing method readily enables the recovery of metallic gold, while reducing the amount of needed etchant materials and minimizing toxic waste generation.

The completed circuit product 290 after etching (FIG. 1) is then stripped of the residual layer 292 of photoresist thereon. This is accomplished in a preferred embodiment by contacting the residual layer 292 with a resist stripper known in the art. An exemplary resist stripper suitable for this purpose is manufactured by EKC Technology of Hayward, Calif. under the designation "712-D" which is applied at a temperature of about 93 degrees C. (± about 2 degrees C.). After about 5 minutes, the stripped circuit product 292 is placed in an isopropyl alcohol bath for about 2 minutes, rinsed with deionized $H_2O$ and dried, thereby producing the final circuit 299.

METHOD 2

Figure 3:
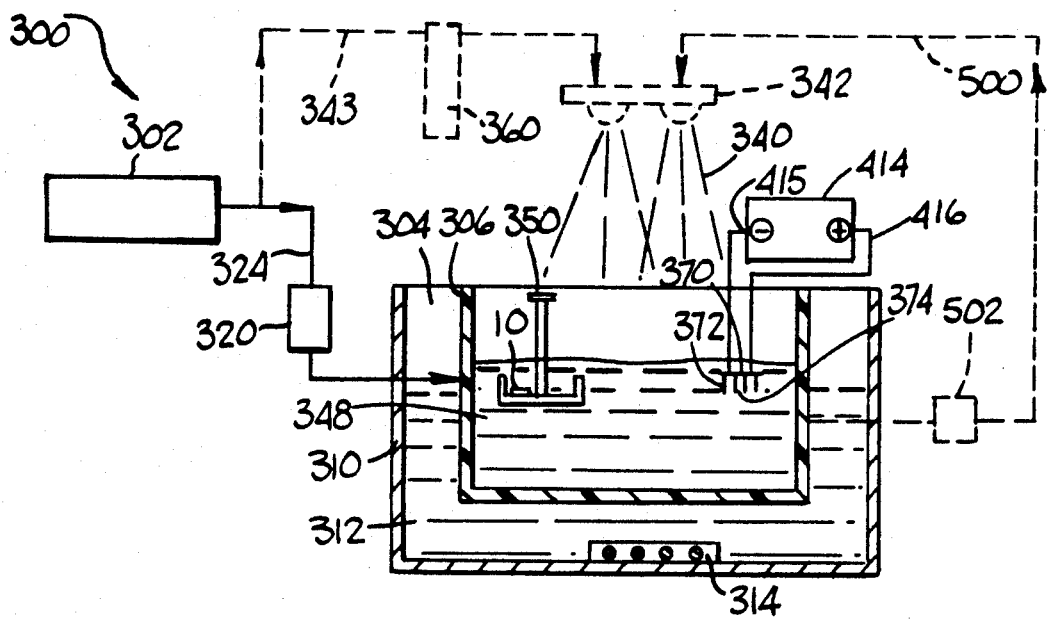
FIG. 3 is a schematic process diagram of a second embodiment of the invention wherein the uncovered metal portions of the structure of FIG. 1 are etched at a constant rate to produce a fine-geometry circuit structure.

This etching method is schematically illustrated in FIG. 3. It should again be noted that the present invention as indicated in the following method shall not be limited to any specific equipment units and/or chemicals which may be described below.

With reference to FIG. 3, a second etching system 300 produced in accordance with the invention is schematically illustrated. The etching system 300 includes a supply 302 of chemical etchant. The chemical etchant in the supply 302 is the same as the etchant listed above in method 1 (e.g. a solution of dissolved KI and dissolved $I_2$.)

Next, the supply 302 of chemical etchant is routed into a reaction vessel 304 also of same type as the reaction vessel 104 described above in method 1. Specifically, the reaction vessel 304 will preferably consist of a first tank 306 which is manufactured of an etch-resistant composition (e.g. high density polyethylene). Contaminants may be removed from the first tank 306 by again passing a preliminary supply of chemical etchant therethrough and discarding the preliminary supply prior to actual use of the main supply 302 of etchant.

The reaction vessel 304 further includes a second tank 310 which is larger than the first tank 306 and is designed to retain a supply 312 of water therein. As in method 1, the second tank 310 is sized to receive the first tank 306 so that the first tank 304 is positioned within the supply 312 of water. The supply 312 of water may then be heated as desired, preferably using a conventional immersion heater 314 known in the art. Heating of the supply 312 of water in this manner imparts heat to the first tank 306 and contents therein, as will be described in greater detail below. The construction materials used to produce the second tank 310 are again not overly critical since it is not coming in contact with any etchant materials.

Like the system 100 described in method 1, system 300 of method 2 may have one or more filter units designed to remove particulates and chemical contaminants from the etchant passing into and/or out of the first tank 306 of the reaction vessel 304. The number and exact position of these filter units in the system 300 may vary, with the embodiment of FIG. 3 including a filter unit 320 positioned within conduit 324 which connects the supply 302 of chemical etchant with the first tank 306. Filter unit 320 (and any other filter units described herein) are of a type well known in the art which may include activated carbon units in combination with conventional polypropylene filter cartridges capable of removing particulates as small as 0.5 micron. Conduit 324 (as well as the other conduits described herein) is produced of an etch-resistant material, including but not limited to polyethylene, polypropylene, or other comparable inert compositions known in the art.

The circuit structure 10 (which is now ready for etching) is then placed in contact with the etchant so that chemical etching of the uncovered portions 46 of gold is achieved. This may be accomplished in two ways as described above in method 1. First, the circuit structure 10 may be contacted with a spray 340 of etchant from a nozzle system 342 positioned above the reaction vessel 304. The nozzle system 342 is operatively connected to the supply 302 of etchant via conduit 343. Unreacted etchant and the gold reaction products therein would then be collected in the first tank 306 of the reaction vessel 304. The use of a nozzle system 342 and spray 340 therefrom (as well as other components associated therewith) are shown in FIG. 3 by dashed lines. In the alternative, the circuit structure 10 may be immersed (e.g. dipped) within a bath 348 of etchant contained within the first tank 306 of the reaction vessel 304. Both dip and spray etching are known in the art, and the relative advantages/disadvantages of each technique are described above in method 1.

During the etching process, the circuit structure 10 is preferably retained within a carrier unit 350 which is schematically illustrated in FIG. 3. The carrier unit 350 may have a plurality of openings therein of variable size (not shown) in order to allow etchant materials to pass therethrough. The carrier unit 350 may also be suitably agitated either manually or automatically using conventional means during etching in order to promote the etching process. Mild agitation is especially important when dip etching is used.

Upon contact of the etchant with the uncovered portions 46 of gold on the circuit structure 10, etching of the gold occurs. The main etching agent in the etchant as previously described is dissolved $I_2$ which functions as a powerful oxidant in an aqueous KI solution. Gold oxidation in this method again proceeds in accordance with reactions (7)–(9) described above in method 1. Thus, as etching proceeds, a liquid product is produced which basically consists of unreacted etchant (including residual, decreased amounts of dissolved $I_2$ and dissolved KI) having a dissolved gold reaction product/complex (e.g. $AuI.KI_{3(aq.)}$) combined therewith.

There are many factors which control the etching rate, with such factors being specifically listed in method 1. As also indicated in method 1, it is necessary to maintain a constant etching rate and consistent degree of undercut in order to ensure that fine-geometry circuit structures (e.g. conductive circuit lines) are produced. A key factor which must be controlled in order to achieve a constant etching rate is the dissolved gold concentration level in the etchant as previously discussed. The uncontrolled accumulation of dissolved gold reaction products within the etchant will greatly reduce the etching rate in the system. In fact, tests have again shown that etching rate decreases linearly as dissolved gold concentration increases. Accordingly, it is necessary to control dissolved gold concentration in the etchant in order to ensure that constant-rate etching is achieved. This is important in dip etching systems where the etching rate in the etchant bath decreases as gold concentration increases. Likewise, it is important in spray etching systems, especially when the unreacted etchant collected in the first tank 306 of the reaction vessel 304 is to be reused/recirculated. The reuse/recirculation of etchant materials having substantial amounts of dissolved gold by-products therein will cause a corresponding decrease in etching rate as further described above.

In order to achieve a constant etching rate in accordance with this embodiment of the present invention, a number of unique procedures are followed. First, when dip etching is desired, the initial etchant from the supply 302 is routed via conduit 324 into the first tank 306 of the reaction vessel 304. Thereafter, the heater 314 is activated in order to heat the supply 312 of water and maintain the etchant at a temperature of about 30–50 degrees C. (optimum=about 30 degrees C.). At 30 degrees C., the solubility of gold in the chemical etchant is about 19 g of gold/liter of etchant. If a temperature of about 50 degrees was used, the solubility of gold in the etchant would be about 22 g of gold/liter. When spray etching is used, the supply 302 of etchant may be preheated to the foregoing temperature level using a resistance heater unit 360 known in the art or any other conventional heating system which may be positioned within or in contact with the conduit 343 so that the etchant from the supply 302 may be heated prior to spraying.

After the etchant contacts the circuit structure 10, a liquid product is generated which consists of unreacted etchant (containing residual dissolved $I_2$ and dissolved KI) combined with substantial amounts of a gold reaction product. This product as described in method 1 is a dissolved gold complex which may be written as follows: $AuI.KI_{3(aq.)}$. As increased amounts of the gold complex are generated, the active etchant ingredients (dissolved KI and dissolved $I_2$) are further depleted and the concentration of dissolved gold (e.g. $AuI.KI_{3(aq.)}$) is increased. The amount of dissolved gold in the liquid product continues to increase, ultimately approaching gold saturation. These processes substantially slow the etching rate in both dip etching systems where the circuit structures are continuously maintained in contact with the contaminated etchant, and in spray etching systems where the contaminated etchant collected in the first tank 30 of the reaction vessel 304 is reused/recirculated.

In this embodiment of the present invention, a unique process is used for removing the dissolved gold reaction product/complex from the unreacted etchant. This process involves the electrodeposition of gold therefrom. Specifically, it has been discovered that electrolytic procedures may be used to extract metallic gold from the gold complex in the liquid product while simultaneously reconverting other portions of the complex back to the original dissolved etchant materials. Basically, this process involves the use of a cathode/anode assembly 370 schematically illustrated in FIG. 4.

Figure 4:
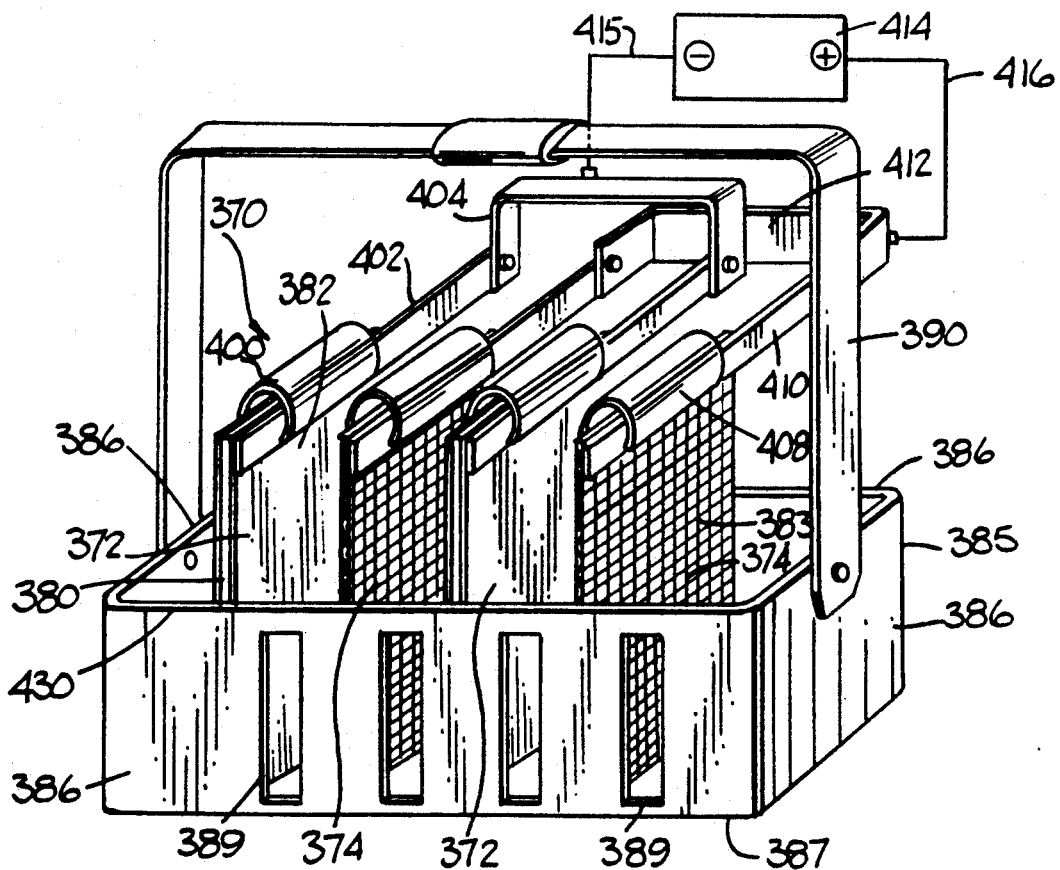
FIG. 4 is an enlarged schematic illustration of a representative cathode/anode assembly used to implement the process of FIG. 3.

With reference to FIG. 4, a cathode/anode assembly 370 suitable for use in this embodiment of the present invention is illustrated. The assembly includes a plurality of cathodes 372 and a plurality of anodes 374 arranged in an alternating relationship as illustrated. While FIG. 4 illustrates two cathodes 372 and two anodes 374, the present invention as described herein may use any number of cathodes 372 and anodes 374, with the number of cathodes 372 and anodes 374 being approximately equal. In a preferred embodiment, each cathode 372 consists of a planar ceramic substrate 380 having a thickness of about 0.1 cm with a layer 382 of metallic gold on each side having a thickness of about 6.0 microns. Such a structure is commercially available from Kyocera, Inc. of San Diego, Calif. In the alternative, other materials suitable for constructing each cathode 372 include but are not limited to elemental gold, gold-plated glass, gold-plated plastics, and the like.

A preferred material used to construct each anode 374 consists of platinized titanium wire mesh 383 which is known in the art and commercially available from the Englehard Co. of East Newark, N.J. This material basically consists of titanium mesh coated with a porous platinum layer having an effective surface area which is far greater than its apparent (e.g. visually observable) surface area. As a result, the effective current density in each anode 374 is much lower than the apparent current density, thereby allowing each anode 374 to operate at quasi-equilibrium conditions even when the apparent current density is high. Alternative materials suitable for use in constructing each anode 374 include but are not limited to platinized niobium and platinized tantalum. While platinized titanium may be used for anode 374 construction, it should not be used to construct the cathodes 372 of the present invention since, at the current densities described below, platinized titanium cathodes will catalyze the cathodic decomposition of water and adversely affect the etchant composition.

The configuration/shape of each cathode 372 and anode 374 must be designed for uniform current distribution. In this regard, the planar structures oriented in a parallel relationship as illustrated in FIG. 4 provide effective results. Incidentally, the cathodes 372/anodes 374 of the present invention may be either plane-parallel as illustrated or curved-parallel in the alternative. The attainment of uniform current distribution in this embodiment of the invention is of substantial importance. Traditionally, in the electrodeposition of metal materials, uneven current distributions yield a corresponding uneven metal deposit thickness. In the present method, uneven current distributions can cause the formation of gold deposits on high current density areas, with gold dissolution occurring at areas of low current density. This problem is not solved by merely increasing the total current. For this reason, the plane-parallel cathode 372/anode 374 configuration described herein is preferred. In addition, the total cathodic surface area (involving all of the cathodes 372 in combination) preferably is about 200 cm$^2$ for each liter of etchant (e.g., about 4000 cm$^2$ for about 20 liters), based on a preferred gold removal rate of about 0.004 g/cm$^2$ per hour. Using these parameters, a cathode system having a 200 cm$^2$ total surface area should be able to remove at least about 3 g of gold from the liquid product over about a 4 hour period.

In addition, it is preferred that all of the cathodes 372 and anodes 374 be oriented in a vertical position as illustrated in FIG. 4. Also, it is preferred that steps be taken to avoid cathodic "edge effects" which basically involve current densities at the edges of the cathodes 372 which are substantially different from the current densities at other portions of the cathodes 372. To accomplish this, the cathodes 372 and anodes 374 may be positioned at least partially within an optional retaining chamber 385 schematically illustrated in FIG. 4. In the embodiment of FIG. 4, the chamber 385 includes side walls 386 and bottom wall 387, although the present invention shall not be limited to only this specific configuration. The chamber 385 may be manufactured of any insulating material which is iodine-resistant including but not limited to glass, polypropylene, high density polyethylene, and the like. In addition, it is preferred that the chamber 385 have an internal width about equal to the width of the cathodes 372/anodes 374, with a height equal to about 0.5 inch less that the height of the cathodes 372/anodes 374. Small outwardly-extending projections (not shown) may optionally be used on the inside of the walls 386 in order to hold the cathodes 372 and the anodes 374 in the vertical orientation shown in FIG. 4, with the cathodes 372 and the anodes 374 being spaced apart from each other by about 1.0 cm. In addition, the side walls 386 will have a plurality of openings 389 therein which are preferably positioned so that they are between the cathodes 372 and anodes 374 of the system. The openings 389 enable the etchant to fill the chamber 385 during operation of the system, and also allow etchant drainage from the chamber 385 after the termination of system operation. The chamber 385 may also optionally include at least one handle 390 in order to facilitate removal and transport of the chamber 385 (and cathodes 372/anodes 374) when desired. A chamber 385 suitable for optional use in the present invention as described herein is commercially available from Fluoroware, Inc. of Chaska, Minn.

With continued reference to FIG. 4, each cathode 372 is connected to a cathode clamp 400 which, in turn, is attached to an elongate cathode connector 402. In a preferred embodiment, the cathode clamp 400 and cathode connector 402 are constructed of titanium. Each cathode connector 402 is operatively attached to a cathode supply bus 404, preferably made of copper. The cathode supply bus 404 electrically connects all of the cathodes 372 together as illustrated in FIG. 4. Likewise, each anode 374 is connected to an anode clamp 408 which, in turn, is attached to an elongate anode connector 410. The anode clamp 408 and the anode connector 410 are also preferably made of titanium. In addition, each anode connector 410 is operatively attached to an anode supply bus 412 which is constructed of copper in a preferred embodiment. It should also be noted that each cathode 372 is separated from each anode 374 in the assembly 370 of FIG. 4 by a preferred distance of about 1.0 cm as noted above.

Following contact between the etchant and the circuit structure 10, the liquid product collected in the reaction vessel 304 is treated in accordance with the electrodeposition process described herein. Specifically, the cathode/anode assembly 370 is operatively connected to an electrical current source in the form of a low voltage, current regulated power supply unit 414 known in the art. For safety purposes, the power supply unit 414 should have an upper output limit of about 10 volts and a current capacity not less than about 20 amps for each liter of liquid product being treated. For example, about 400 amps would be required for treating about 20 liters of liquid product at a current density of about 0.1 amp/cm$^2$ over about 200 cm$^2$ (e.g. the preferred cathodic surface area) for each liter of liquid product. As illustrated in FIG. 3, the "−" end of the power supply unit 414 is operatively connected to the cathode supply bus 404 using conductive line 415, and the "+" end of the power supply unit 414 is operatively connected to the anode supply bus 412 using conductive line 416.

To remove gold from the liquid product contained with the first tank 306 of the reaction vessel 304, all electrical connections are made between the power supply unit 414 and the cathodes 372/anodes 374 using the cathode connector 402, the anode connector 410, the cathode supply bus 404, and the anode supply bus 412. After connection of the power supply unit 414 to the cathodes 372/anodes 374, the power supply unit 414 is activated, with the cathodes 372, anodes 374, and chamber 385 (if used) being thereafter immersed within the liquid product containing dissolved gold. If the chamber 385 is used to retain the cathodes 372/anodes 374 therein, the immersion depth of the chamber 385 should be limited so that the upper edge 430 of the chamber 385 (FIG. 4) is not submerged within the liquid product. This avoids the formation of increased current densities at the edges of the cathodes 372.

In addition, the power supply unit connected to the cathodes 372 and anodes 374 should be activated (e.g. turned on) prior to immersion of the cathodes 372 and anodes 374 into the liquid product so that an electrical potential is applied to the cathodes 372 and anodes 374 prior to immersion. This is important because immersion of unenergized cathodes 372 in the liquid product (which contains significant amounts of etchant) will cause the etching of gold therefrom. Furthermore, the cathodes 372 and anodes 374 (especially the cathodes 372) should be removed from the liquid product before the power supply 414 is deactivated.

In a preferred embodiment, the applied voltage from the power supply unit 414 should be about 3-5 V (about 4 V=optimum). Likewise, the resulting current density applied to the cathodes 372 and anodes 374 of the cathode/anode assembly 370 should be about 65-120 mA/cm² (about 85 mA/cm²=optimum).

As a result, metallic gold particles form on the surfaces of the cathodes 372 at a rate of about 4-16 mg/cm² per hour. It is preferred that the gold particles be removed from the cathodes before they fall off and back into the liquid product. Otherwise, any particles which fall into the liquid product will dissolve therein. Also, removal of the collected gold particles from the surfaces of the cathodes 372 increases the deposition of new gold particles thereon. In a preferred embodiment, the cathodes 372, anodes 374, and chamber 385 (if used) are withdrawn from the liquid product at a pre-selected time interval (e.g. about every 15 minutes) and rinsed with deionized water. The rinse water (which includes gold particles received/removed from the cathodes 372 and the chamber 385 (if used)) is then conventionally filtered (by vacuum filtration or the like) in order to isolate the gold particles therefrom.

In addition, the electrolytic process described above decomposes the dissolved gold complex at the cathodes 372 and restores the iodide ($2I^-$) to iodine ($I_2$) at the anodes 374 so that the original etching solution (containing dissolved KI and dissolved $I_2$) is regenerated and recovered. More specifically, the process of this method recovers metallic gold from the dissolved gold complex (e.g., $AuI.KI_{3(aq.)}$), and automatically reconverts the corresponding iodide to dissolved iodine, thereby restoring the etchant to its selected controlled point composition in accordance with the following reactions:

At the cathodes 372:

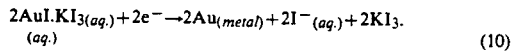
$$2AuI.KI_{3(aq.)} + 2e^- \rightarrow 2Au_{(metal)} + 2I^-_{(aq.)} + 2KI_{3(aq.)}. \quad (10)$$

At the anodes 374:

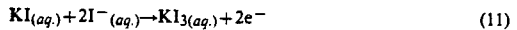
$$KI_{(aq.)} + 2I^-_{(aq.)} \rightarrow KI_{3(aq.)} + 2e^- \quad (11)$$

The overall result of these reactions is shown as follows:

$$2AuI.KI_{3(aq.)} + KI_{(aq.)} \rightarrow 2Au_{(metal)} + 3KI_{3(aq.)} \quad (12)$$

Thus, in accordance with this embodiment of the present invention, metallic gold may be readily collected, along with simultaneous etchant regeneration. Such regeneration offers numerous benefits with respect to material recovery and the promotion of constant-rate etching. Accordingly, in a dip etching process, continuous operation of the etching system 300 and cathode/anode assembly 370 as described herein will enable the dissolved gold concentration level in the etchant/liquid product to be maintained at a consistent value, thereby ensuring that the etching rate is constant. As a result, fine-geometry circuit structures can be produced. In a dip etching process, continuous use of the electrodeposition procedure of this embodiment can result in a low dissolved gold concentration of about 6 g of gold/liter of etchant which is substantially below the etchant saturation point which is approximately 19-22 g of gold/liter of etchant (at a temperature of about 30-50 degrees C.). In the alternative, the cathode/anode assembly 370 of the etching system 300 may be cycled on and off as desired so that once a selected gold concentration level is reached (e.g. as determined by experimental time trials), the cathode/anode assembly 370 is turned on until a lower level is reached. For example, the assembly 370 could be activated when about 9 g of gold/liter of etchant is reached, and deactivated when a concentration level of about 6 g of gold/liter of etchant is achieved.

In a spray etching process, it is contemplated that the cathode/anode assembly 370 of the system 300 may run either continuously or periodically, with the resulting regenerated etchant being routed via a conduit 500 which includes an in-line filter 502 therein (shown in dashed lines in FIG. 3) back to the nozzle system 342. Regardless of whether dip or spray etching is used, the method of this embodiment ensures that the circuit structure 10 is placed in contact with regenerated etchant at all times so that the etching rate may be maintained at a constant level.

Finally, it should be noted that method 2 as described above has an additional advantage in that only very minimal amounts of fresh etchant will need to be added to the system 300. This is possible because of the direct regeneration of the components used in the original etching solution (e.g. dissolved $I_2$ and dissolved KI). The addition of very minor amounts of fresh etchant may be periodically needed in view of minor losses by drag out which accompany the removal of etched substrates upon completion, as well as the removal of other components (e.g. cathode/anode assemblies) which are used in the etching process. In addition, certain minor etchant losses occur because of a cathodic side reaction which proceeds at a very small rate as follows:

$$2H_2O + 2e^- \rightarrow H_{2(g)} + 2OH^- \quad (13)$$

In addition, the balancing current at the anodes 374 stoichiometrically drives the following anodic reaction:

$$3KI_{(aq.)} \rightarrow KI_{3(aq.)} + 2K^+ + 2e^- \quad (14)$$

Furthermore, the following additional reactions are taking place:

$$KI_{3(aq.)} \rightarrow KI_{(aq.)} + I_{2(gas)} \quad (15)$$

$$2OH^- + 2K^+ \rightarrow 2KOH_{(aq.)} \quad (16)$$

The net result is a summation of reactions (13)–(16) as follows:

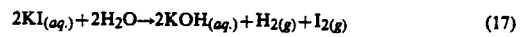
$$2KI_{(aq.)} + 2H_2O \rightarrow 2KOH_{(aq.)} + H_{2(g)} + I_{2(g)} \quad (17)$$

Accordingly, the loss of $I_{2(g)}$ (unless trapped and reintroduced into the system) will require the introduction of small amounts of fresh etchant from the supply 302, although such amounts will be minimal, and will not affect the unique economy of operation which is inherent in the process of method 2.

In addition, the net result of reaction (17) also involves the conversion of $KI_{(aq.)}$ to $KOH_{(aq.)}$ as illustrated above. Unless neutralized or eliminated, increasing amounts of $KOH_{(aq.)}$ can cause slight decreases in gold solubility and the overall etching rate. Thus, depending on the amount of $KOH_{(aq.)}$ generated (which, in turn, depends on how long the system is operating and how much etching has been completed), it may be necessary to chemically eliminate the $KOH_{(aq.)}$. This can be readily accomplished through conversion of the $KOH_{(aq.)}$ to $KI_{(aq.)}$ by neutralization with $HI_{(aq.)}$ in accordance with the following reaction:

$$2KOH_{(aq.)} + 2HI_{(aq.)} \rightarrow 2H_2O + 2KI_{(aq.)} \tag{18}$$

After etching of the circuit structure 10 is completed in accordance with this embodiment, it is further processed to produce the final circuit 299 as described above in method 1.

The present invention represents an advance in the art of circuit fabrication technology. Not only does it enable the efficient production of fine-geometry circuit structures using thick-film technology, but it accomplishes this objective using minimal amounts of chemicals while minimizing the production of chemical wastes. Having herein described preferred embodiments of the present invention, it is anticipated that suitable modifications may be made thereto by individuals skilled in the art which nonetheless remain within the scope of the invention. For example, the present invention shall not be limited to the use of any specific hardware, system configurations/components, and the like. Thus, the present invention shall only be construed in accordance with the following claims:

We claim:

1. A method for the controlled-rate chemical etching of a metallized substrate in order to produce fine-geometry circuit lines thereon comprising the steps of:
providing a substrate;
applying a layer of gold onto said substrate;
applying a layer of photoresist onto said layer of gold;
removing at least a portion of said layer of photoresist in order to form an uncovered portion of gold and a covered portion of gold;
contacting said uncovered portion of gold with a chemical etchant, said chemical etchant comprising a mixture of dissolved $I_2$ and dissolved KI, said chemical etchant etching said uncovered portion of gold from said substrate, said etching of said uncovered portion of gold forming a liquid product comprising unreacted chemical etchant in combination with a dissolved gold complex;
cooling said liquid product in an amount sufficient to precipitate said dissolved gold complex from said unreacted chemical etchant, said cooling resulting in the formation of a gold precipitate;
separating said gold precipitate from said unreacted chemical etchant;
heating said unreacted chemical etchant after said separating of said gold precipitate therefrom in an amount sufficient to generate a supply of heated, recovered etchant solution; and
contacting said uncovered portion of gold on said substrate with said heated, recovered etchant solution in order to continue said etching of said uncovered portion of gold.

2. The method of claim 1 wherein said chemical etchant is maintained at a temperature of about 30–50 degrees C. during said etching of said uncovered portion of gold.

3. The method of claim 1 wherein said cooling of said liquid product comprises the step of cooling said liquid product to a temperature of about 0–4 degrees C.

4. The method of claim 1 wherein said heating of said unreacted chemical etchant after said separating of said gold precipitate therefrom comprises the step of heating said unreacted chemical etchant to a temperature of about 30–50 degrees C.

5. The method of claim 1 wherein said contacting of said uncovered portion of gold with said chemical etchant comprises the step of applying a spray of said chemical etchant onto said uncovered portion of gold, said liquid product being collected within a reaction vessel.

6. The method of claim 1 wherein said contacting of said uncovered portion of gold with said chemical etchant comprises the steps of:
providing a reaction vessel;
supplying said reaction vessel with said chemical etchant;
immersing said uncovered portion of gold into said chemical etchant within said reaction vessel, said liquid product being collected within said reaction vessel; and
transferring said liquid product to a separate cooling chamber in order to accomplish said cooling of said liquid product.

7. The method of claim 6 wherein said contacting of said uncovered portion of gold with said heated, recovered etchant solution comprises the step of transferring said heated, recovered etchant solution back into said reaction vessel.

8. The method of claim 1 further comprising the steps of:
combining said gold precipitate with water in an amount sufficient to form a plurality of AuI crystals; and
heating said AuI crystals in an amount sufficient to produce metallic gold therefrom.

9. The method of claim 8 further comprising the steps of:
separating said AuI crystals from any remaining liquid materials left over after said combining of said gold precipitate with said water; and
contacting said uncovered portion of gold on said substrate with said remaining liquid materials in order to continue said etching of said uncovered portion of gold.

10. A method for the controlled-rate chemical etching of a metallized substrate in order to produce fine-geometry circuit lines thereon comprising the steps of:
providing a substrate;
applying a layer of gold onto said substrate;
applying a layer of photoresist onto said layer of gold;
removing at least a portion of said layer of photoresist in order to form an uncovered portion of gold and a covered portion of gold;
contacting said uncovered portion of gold with a chemical etchant, said chemical etchant being maintained at a temperature of about 30–50 degrees C. and comprising a mixture of dissolved $I_2$ and dissolved KI, said chemical etchant etching said uncovered portion of gold from said substrate, said etching of said uncovered portion of gold forming a liquid product comprising unreacted chemical etchant in combination with a dissolved gold complex;
cooling said liquid product to a temperature of about 0–4 degrees C. in order to precipitate said dissolved gold complex from said unreacted chemical etchant, said cooling resulting in the formation of a gold precipitate;

separating said gold precipitate from said unreacted chemical etchant;

heating said unreacted chemical etchant after said separating of said gold precipitate therefrom to a temperature of about 30–50 degrees C. in order to generate a supply of heated, recovered etchant solution; and contacting said uncovered portion of gold on said substrate with said heated, recovered etchant solution in order to continue said etching of said uncovered portion of gold.

11. The method of claim 10 wherein said contacting of said uncovered portion of gold with said chemical etchant comprises the step of applying a spray of said chemical etchant onto said uncovered portion of gold, with said liquid product being collected in a reaction vessel.

12. The method of claim 10 wherein said contacting of said uncovered portion of gold with said chemical etchant comprises the steps of:

providing a reaction vessel;

supplying said reaction vessel with said chemical etchant;

immersing said uncovered portion of gold into said chemical etchant in said reaction vessel, with said liquid product being collected within said reaction vessel; and transferring said liquid product to a separate cooling chamber in order to accomplish said cooling of said liquid product.

13. The method of claim 12 wherein said contacting of said uncovered portion of gold with said heated, recovered etchant solution comprises the step of transferring said heated, recovered etchant solution back into said reaction vessel.

14. The method of claim 10 further comprising the steps of:

combining said gold precipitate with water in an amount sufficient to form a plurality of AuI crystals; and heating said AuI crystals to a temperature of about 100–150 degrees C. in order produce metallic gold therefrom.

15. A method for the controlled-rate chemical etching of a metallized substrate in order to produce fine-geometry circuit lines thereon comprising the steps of:

providing a substrate;

applying a layer of gold onto said substrate;

applying a layer of photoresist onto said layer of gold;

removing at least a portion of said layer of photoresist in order to form an uncovered portion of gold and a covered portion of gold;

contacting said uncovered portion of gold with a chemical etchant, said chemical etchant comprising a mixture of dissolved $I_2$ and dissolved KI, said chemical etchant etching said uncovered portion of gold from said substrate, said etching of said uncovered portion of gold forming a liquid product comprising unreacted chemical etchant in combination with a dissolved gold complex;

providing at least one cathode and at least one anode;

immersing said cathode and said anode within said liquid product;

passing an electrical current through said cathode and said anode immersed within said liquid product in an amount sufficient to cause said dissolved gold complex to be converted to both metallic gold and a regenerated etchant solution comprising dissolved KI and dissolved $I_2$, said metallic gold collecting on said cathode during said passing of said electrical current therethrough; and contacting said uncovered portion of gold on said substrate with said regenerated etchant solution in order to continue said etching of said uncovered portion of gold.

16. The method of claim 15 wherein said electrical current is about 65–120 mA/cm$^2$.

17. The method of claim 15 further comprising the steps of:

providing an electrical current source;

connecting said electrical current source to said cathode and said anode; and activating said electrical current source prior to said immersing of said cathode and said anode within said liquid product in order to apply an electrical potential to said cathode and said anode prior to said immersing thereof within said liquid product.

18. The method of claim 15 further comprising the steps of:

withdrawing said cathode from said liquid product after said collecting of said metallic gold thereon and before said metallic gold falls off of said cathode; and removing said metallic gold from said cathode after said withdrawing of said cathode from said liquid product.

19. The method of claim 15 wherein said chemical etchant is maintained at a temperature of about 30–50 degrees C. during said etching of said uncovered portion of gold.

20. The method of claim 15 wherein said contacting of said uncovered portion of gold with said chemical etchant comprises the step of applying a spray of said chemical etchant onto said uncovered portion of gold, with said liquid product being collected in a reaction vessel.

21. The method of claim 15 wherein said contacting of said uncovered portion of gold with said chemical etchant comprises the steps of:

providing a reaction vessel;

supplying said reaction vessel with said chemical etchant; and immersing said uncovered portion of gold into said chemical etchant within said reaction vessel, said liquid product being collected within said reaction vessel.

22. A method for the controlled-rate chemical etching of a metallized substrate in order to produce fine-geometry circuit lines thereon comprising the steps of:

providing a substrate;

applying a layer of gold onto said substrate;

applying a layer of photoresist onto said layer of gold;

removing at least a portion of said layer of photoresist in order to form an uncovered portion of gold and a covered portion of gold;

contacting said uncovered portion of gold with a chemical etchant, said chemical etchant comprising a mixture of dissolved $I_2$ and dissolved KI, said chemical etchant etching said uncovered portion of gold from said substrate, said etching of said uncovered portion of gold forming a liquid product comprising unreacted chemical etchant in combination with a dissolved gold complex;

providing at least one cathode and at least one anode;

providing an electrical current source;

connecting said electrical current source to said cathode and said anode;

activating said electrical current source in order to apply an electrical potential to said cathode and said anode;

immersing said cathode and said anode within said liquid product, said electrical current source causing an electrical current of about 65-120 mA/cm$^2$ to flow through said cathode and said anode, said electrical current being sufficient to convert said dissolved gold complex into both metallic gold and a regenerated etchant solution comprising dissolved KI and dissolved $I_2$, said metallic gold collecting on said cathode during application of said electrical current thereto; and contacting said uncovered portion of gold on said substrate with said regenerated etchant solution in order to continue said etching of said uncovered portion of gold.

23. The method of claim 22 further comprising the steps of:

withdrawing said cathode from said liquid product after said collecting of said metallic gold thereon and before said metallic gold falls off of said cathode; and removing said metallic gold from said cathode after said withdrawing of said cathode from said liquid product.

24. The method of claim 22 wherein said chemical etchant is maintained at a temperature of about 30-50 degrees C. during said etching of said uncovered portion of gold.

25. The method of claim 22 wherein said contacting of said uncovered portion of gold with said chemical etchant comprises the step of applying a spray of said chemical etchant onto said uncovered portion of gold, with said liquid product being collected in a reaction vessel.

26. The method of claim 22 wherein said contacting of said uncovered portion of gold with said chemical etchant comprises the steps of:

providing a reaction vessel;

supplying said reaction vessel with said chemical etchant; and immersing said uncovered portion of gold into said chemical etchant within said reaction vessel, said liquid product being collected within said reaction vessel.

* * * * *